United States Patent [19]

Hollimon

[11] Patent Number: 4,523,506

[45] Date of Patent: Jun. 18, 1985

[54] ELECTRONIC TUNING AID

[76] Inventor: Marshall H. Hollimon, 11155 La Paloma Dr., Cupertino, Calif. 95014

[21] Appl. No.: 572,883

[22] Filed: Jan. 23, 1984

[51] Int. Cl.[3] ........................ G10G 1/00; G09B 15/00; G01R 23/10

[52] U.S. Cl. .................................... 84/454; 84/477 R; 364/484; 324/78 D

[58] Field of Search ................. 84/454, 470 R, 477 R, 84/478, DIG. 18; 364/484; 324/78 D, 78 Z

[56] References Cited

U.S. PATENT DOCUMENTS 4,273,023 6/1981 Mercer .................................. 84/454

4,319,515 3/1982 Mackworth-Young .............. 84/454

4,434,697 3/1984 Roses .................................... 84/454

*Primary Examiner*—William B. Perkey

*Attorney, Agent, or Firm*—Michael L. Harrison

[57] ABSTRACT

An electronic, tempered scale tuning aid employs a transducer and signal processing means to detect and amplify a signal to the level required by digital logic circuits, which circuits are used to gate a precisely determined oscillator, which is arithmetically related to the operating range of the instrument through a counting and analyzing apparatus. By scaling the measured count, a display in musical notation of both absolute pitch and intonation error is obtained.

2 Claims, 6 Drawing Figures

ELECTRONIC TUNING AID

BACKGROUND OF THE INVENTION

1. Field of the Invention

This invention relates to the field of musical tuning aids and more specifically to electronic tuning aids having the capability of determining the degree of deviation from theoretically perfect intonation.

2. Prior Art

Tuning of a musical instrument traditionally involved the player listening to a reference note, which may be the note sounded by one of the other players of an ensemble, and adjusting the first player's instrument until the corresponding note is consonant with the reference note. Detection of correct intonation involves a subconscious comparison of the two notes until the combination of the two produces a specified beat note rate, usually, "zero" beat.

The determination of correct intonation is a skill which is acquired as a part of the player's basic musicianship training and which is acquired only after long hours of practice. As with many acquired skills, the accuracy of the intonation which results is a combination of the inherent talent of the performer and the diligence with which the task is pursued.

Attempts have been made to provide additional training aids for the teaching of intonation, by use of electromechanical, mechanical or electronic instruments which can detect the presence or absence of the desired intonation characteristics.

Musicians of lesser skill, such as many members of high school bands and other amateur performing groups are generally greatly assisted by the use of such tuning aids. However, professional players can also benefit from comparison of their intonation with a theoretically perfect standard. A number of tuning aid devices have been proposed to take advantage of these markets, some of which are discussed below.

Prior art frequency meters and tuning aids employ period-measuring circuits which detect the zero-crossings of the output of a suitable transducer. The inverse of period may then be computed and the frequency of the tone thus determined and displayed.

Such instruments can give quite accurate results, but suffer from the drawback that the displayed value has little meaning to a musician who thinks not in terms of physical units but rather in terms of subjective psychoacoustic phenomena such as "pitch", and who denotes pitch in terms of musical notes, not cycles per second, or Hertz.

A widely used tuning aid, see e.g., Krauss, U.S. Pat. No. 2,806,953, employs rotating discs having the familiar alternating dark and light areas employed for stroboscopic "motion stopping". The strobe light in this case is caused to flash in synchronism with the frequency of the sound impinging upon an input microphone. The patterns on the rotating discs correspond to the various notes of the musical scale. When a particular note is being sounded, the pattern for that note appears to stop. Slightly sharp notes, which are close to the theoretically correct pitch, cause the pattern to appear to move slowly clockwise, while slightly flat notes close to the theoretically correct pitch cause the pattern to appear to move slowly counter-clockwise.

While the stroboscopic disc tuning instrument is effective and accurate and has enjoyed considerable commercial success, it suffers from several drawbacks: (1) it is an electromechanical device and is subject to the usual afflictions which plague such systems; (2) being electromechanical, it is rather expensive; (3) the display is small, and consequently difficult to read at a distance, thereby limiting its usefulness in large rehearsal halls, and; (4) it is easily damaged by shock or mishandling.

The stroboscopic unit has several additional drawbacks which adversely affect its usefulness: (1) it does not produce an audible tone; (2) it is too heavy to be easily carried, and; (3) it is necessary in order to employ the stroboscopic tuner that the user be able to distinguish the direction of rotation of the pattern as well as the rate of rotation, requiring rather close inspection of the rotating discs.

Several variants of the stroboscopic tuning technique have been proposed. For example, Younquist No. 3,901,120 describes a system which detects electronic synchronism between the incoming unknown tone and one of a plurality of reference frequencies. The reference frequencies take the place of the rotating discs while electronic comparators take the place of visual detection of synchronism. Because an electronic comparator provides a useful signal output, any number of displays and any number of different types of displays may be employed. Light-emitting diodes are suggested by Youngquist, thereby eliminating one objection to the stroboscopic technique. However, the difficulty of discerning slightly sharp and flat tuning remains a problem.

Another type of electronic apparatus uses a comparison of a known frequency standard, such as the output frequency of a crystal-controlled oscillator, with the frequency of the unknown signal being measured. Both signals are electronically conditioned to provide a fairly pure sine waveform before they are applied to the vertical and horizontal deflection plates of a cathode ray tube oscillospoce. When the notes are identical in frequency, a circular "Lissajous" pattern is formed on the screen. When sharp or flat, the Lissajous pattern will appear to rotate at a rate which is determined by the magnitude of the departure of the frequency of the unknown signal from the frequency of the reference signal.

A similar oscilliscope-based device employs an oscilloscope having a known horizontal sweep rate which sweep rate is compared with the unknown signal input. When the signal is properly synchronized, a stationary waveform will appear on the oscilloscope screen. When slightly too sharp, the pattern appears to move to the left. When slightly too flat, the pattern appears to move to the right.

The indications available from these oscilloscope-based instruments are ambiguous to the user in that the degree of the inaccuracy of the incoming pitch cannot be readily determined. In the case of the first type of oscilloscope display described, it is difficult to determine both direction (sharp or flat) and the degree of departure from theoretically perfect intonation. Since the user is unable to determine the needed information by merely viewing the oscilloscope screen he can never be absolutely sure of his intonation. Moreoever, as a training aid, these devices are deficient in that they do not readily indicate in which direction the pitch of the unknown signal must be varied in order to bring it closer to the theoretically correct pitch.

A purely electronic approach to determining the frequency of an unknown signal is described by Faber, Jr., et al., U.S. Pat. No. 3,144,802. Faber, et al., employs a conventional digital counter reading a known reference frequency which is gated by the zero crossings of the signal at the unknown signal input. Suitable electronic displays may be devised so that the output is directly readable by the user.

Each of the prior art systems described above suffers from one or more of a group of several disadvantages. First, the display indications are ambiguous in that it is difficult to make an accurate assessment of the degree of departure from perfect intonation. Second, the output indications are also ambiguous in that it is difficult to determine the center frequency of the note being sounded in some cases. Third, the outputs also do not indicate in which direction the information error lies from the theoretically correct intonation. In some of the prior art devices, if the sounded note is not approximately correct, no indication at all can be detected in the tuning aid.

For many of the tuning aids described, unless the player knows, to a fair degree of accuracy, the tone he is attempting to sound, a readout from the tuning aid will not be meaningful. Thus, for example, if a player is attempting to sound a B natural, but is quite sharp, the stroboscopic tuning aid may not register correct pitch either for the B or for the next higher C. In a more extreme case, if the player is extremely sharp, he will be misled by the stroboscopic indicator into believing that he is on correct pitch when he is fingering B natural, but actually sounding a C, unless he makes a careful inspection of the dial indicators for the instruments.

In addition, some of the apparatuses described are heavy and, being electromechanical, are expensive and have a tendency toward unreliability.

SUMMARY OF THE INVENTION

Accordingly, a need exists for a tuning aid which eliminates the above identified problems.

The present invention has as an object to provide a tuning aid which can indicate both the theoretically correct center frequency of the note actually sounded, and the degree of deviation which the note actually sounded makes from the theoretically correct pitch.

It is another object of the present invention to provide an apparatus for determining the direction of deviation from theoretically correct pitch of an out-of-pitch sounded note.

Still another object of the present invention is to provide a tuning aid which has a visual indicator which is useful at large distances from the user.

DESCRIPTION OF THE PREFERRED EMBODIMENT

Background: Tuning Systems and Notations

Figure 1:
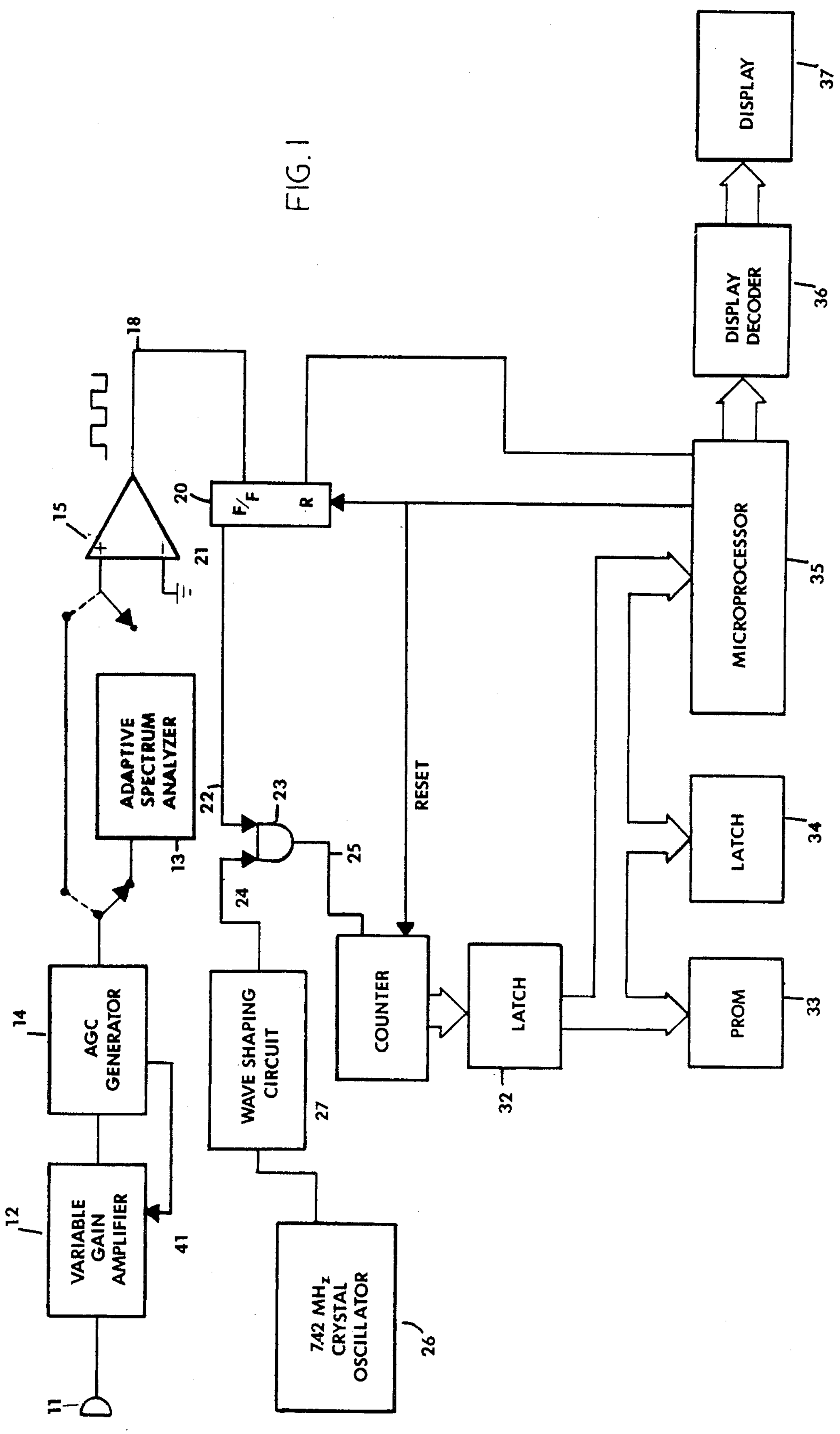
FIG. 1 is a simplified overall block diagram of the tuning aid in accordance with the present invention.

Early in the history of musical expression it was recognized that certain musical consonances occured when simultaneous or successive musical tones were related by intervals called "octaves", "fifths", "fourths", etc. These consonances, in turn, occurred when vibrating strings were stopped at certain simple, numerically exact ratios such as $\frac{1}{2}$, $\frac{2}{3}$, $\frac{3}{4}$ of their lengths. Vibrating strings stopped at the ratios produce, respectively, an octave, a fifth and a fourth. Early musical scales were based on tuning systems which were derived directly from these mathematically perfect ratios. Scales which are based upon these perfect ratios, and instruments tuned to play them, embody what is called the system of "just tuning" or "just intonation".

These perfect ratios may be produced in any musical key on those classes of instruments which are capable of infinite adjustment of their intonation. Such instruments include orchestral strings, trombones, and so forth. For instruments which have rigidly fixed tunings, however, e.g. pianos, or xylophones, etc., or which have tuning capable of only limited variation, e.g. valved brass or keyed woodwind instruments, reproduction of just intonation is difficult or impossible.

When a fixed-tuned instrument such as a piano is tuned to perfect intervals for a given key, or, in other words when tuned for a given key by the system of just intonation, the intervals for other keys will, in general, not be perfect. The early keyboard instruments tuned by just intonation produced pleasing, consonant chords only when played in a limited number of keys, typically B-flat, C and F. When played in other keys, the intervals would depart from the theoretically correct intervals of just intonation, by a sufficient degree to render the results unpleasant.

Thus, instruments which have been tuned in the perfect ratios required for just intonation are limited as to the number of musical keys for which they may be satisfactorily employed.

The desire to have musical instruments capable of playing consonantly in any key which is specified by a composer lead to the development of a musical scale in which all half steps are related by the same fixed numerical ratio. Thus, the half steps in any octave, selected in any key, are made to be all of the same relative frequency ratio with respect to one another. This tuning method is referred to as the "tempered scale" or the "even-tempered scale" and for the 12 half tones of the conventional chromatic scale prevalent in western music, the frequency ratio of each successively higher half step tone with respect to the next lower half-step tone is defined as $2^{1/12}$, which has the numerical value of 1.059463 - - - . From this relationship, all other tone intervals in the tempered scale can be expressed as appropriate fractional powers of 2. Furthermore, the two notes at the extreme of every given interval in the musical scale will have a fixed frequency ratio with respect to one another which is dependent only on the number of half-tones separating that note from any other. This is true regardless of the scale on which it occurs and regardless of the position of the two notes within that scale. Use of the even-tempered scale allows musical composition in all possible key signatures with equal and contstant intonation. Because of this property, the even-tempered scale has been universally adopted and is universally used in western music.

The need for a precise method of expressing tuning relationships has resulted in a method and system of further division of the musical scale whereby each tempered semi-tone or half-tone is divided into 100 sub-intervals, all of an equal ratio with respect to each succeeding sub-interval. Each individual sub-interval is referred to as a musical "cent" and is defined as $¢=2^{1/1200}$, which is numerically equal to 1.0057779 - - - .

To a practising musician, the frequency ratio of 1.00057779 - - - is relatively unimportant as a pure number. What is important to the musician is the fact that two tones which are tuned to intervals which are within 5¢ of one another cannot be distinguished from each other by the human ear. Thus, the cent, ¢ is a convenient way of specifying tuning accuracy.

In order to be able to describe and distinguish which note, in which octave, of the musical scale is being considered, the Accoustical Society of America and the United States Standards Association have adopted a notation system for the notes or tones of the musical scale. This system has as its basic reference frequency the note C, whose frequency is chosen as approximately the lower frequency threshold of hearing. This C has the defined frequency of 16.352 Hz and is notated "$C_0$". All other notes up to one octave above $C_0$ also bear the subscript "0" notations. The "B" above $C_0$ is thus notated $B_0$. The next higher note, an octave above $C_0$, becomes $C_1$ and so forth. In this notation system, the standard orchestral tuning tone of A=440 Hz is notated "$A_4$".

This notation system allows easy specification of each individual note in a musical scale. For this reason it will be employed throughout the following description of the preferred embodiment.

OVERVIEW OF THE APPARATUS

Referring now to FIG. 1, there is shown in a simplified block diagrammatical form, the preferred embodiment of the present tuning apparatus. An incoming frequency $f_i$ impinges upon a transducer 11, causing an electrical signal to be applied to the input of variable gain amplifier 12. Amplifier 12 takes the relatively weak transducer signal and boosts it to a level which makes further signal processing more manageable and less susceptible to noise.

A gain control input 41 to the variable gain amplifier 12 controls the output level available from the amplifier by automatically adjusting its gain in response to a signal fed back from the automatic gain control generator (AGC generator) 14. AGC generator 14 produces a signal whose amplitude varies in accordance with the input level to the AGC generator which signal is of the proper sense and amplitude so that as the input to AGC generator 14 falls, the feedback signal adjusts the gain of variable gain amplifier 12 upward. When the signal level is too high, gain is reduced, by a feedback signal of opposite sense. Thus, the output signal from variable gain amplifier 12 is maintained at a constant amplitude.

Other methods of signal conditioning may also be employed so long as the primary objective of producing a stable, predictable zero-crossing, is achieved. A limiting amplifier has this desired attribute but is rendered somewhat less attractive than a linear, automatic gain-controlled amplifier by the fact that the non-linearity of the limiting process enhances harmonics and suppresses fundamentals thus aggravating a problem which already exists with respect to certain types of instruments.

The output of the variable-gain amplifier 12 is passed without attenuation by the AGC generator and is applied to a relatively sharp cut-off, low-pass filter 13 which is intended to reduce the amplitude of overtones with respect to the fundamental frequency $f_i$. For most orchestral instruments, and indeed for most traditional instruments of all categories, the instrument's fundamental is significantly more powerful than the overtones. However, for certain instruments, notably the bassoon, and for the flute and the trombone when played in their lower registers, several overtones are greater in amplitude than the fundamental, which may in some cases lead to a false indication of the fundamental frequency. The low pass filter 13 reduces the amplitude of the overtones with respect to the fundamental so that a correct determination of the fundamental frequency can be made.

The purpose of the limiting amplifier 14 is to increase the slew rate of the signal in the area of its zero-crossings, so that an accurate representation of its period can be derived.

The signal derived from the AGC controlled amplifier chain 12 and 14 is applied to the unknown input of comparator 15. Comparator 15 has a two-level logic output with the "one" state defined as the condition in which the unknown input being more positive than the reference input, and the "zero" state defined as the condition in which unknown input being less positive than the reference input. Within a (desirably) small threshold area where the input levels are extremely close, the output is undefined.

For detection of zero-crossings, the reference will be defined as equal to zero volts, assuming the amplifier chain 12 and 14 output is a symmetrical waveform having no DC offset and centered about zero volts.

The output levels of the comparator 15 are chosen to be compatible with the digital circuit elements which follow. The output signal of the comparator 15 is applied to the input 19 of a gate generator circuit 20 which, in its simplest form, may consist of a single-stage flip-flop configured to divide by 2 on either the leading or trailing edge of the output signal. If the flip-flop is configured to trigger on the trailing edge of the output of the comparator 15, for example, then the output of the flip-flop will change states once for each trailing edge transition of the comparator output. This corresponds to exactly the time interval spanned by one period of the incoming signal $f_i$.

The output 21 of the gate generator 20 is applied to one input 22 of a digital gate 23 which is here depicted as a simple, two-input AND gate.

The second input 24 of the AND gate 23 is fed with a signal derived from crystal oscillator 26 and wave-shaping circuit 27.

The crystal oscillator 26 is selected to have a frequency of precisely 7,420,198.7 Hz, for reasons which are explained in the following paragraphs. The oscillator preferably has high short-term and long-term stability and has minimal detuning as the result of temperature changes. A crystal oscillator is preferred in order to achieve both of these objectives.

The output of the crystal oscillator is amplified and wave-shaped by wave shaping circuit 27 whose output is compatible with the digital logic levels required by AND gate 23.

The output of AND gate 23 is a gated burst of the signal of crystal oscillator 26, the length of which burst is dependent upon the period of the incoming signal $f_i$.

The gated burst, which will be referred to as the "count" or "M", is applied to the least significant bit stage of a straight binary counter, having length such that it can contain a count equal to the highest value of a binary word, corresponding to the lowest frequency tone, for which operation by the apparatus is defined. Thus, for a sounded note at $A_1$ plus 50¢, corresponding to a frequency of 56.6 Hz, the counter must be able to contain a count of 131,072 which corresponds to a binary counter having 17 stages.

With each sample of the incoming frequency of $f_i$ which is gated through the counter, a binary word represpresentative of the ratio of the input frequency to the frequency of the crystal oscillator is derived and stored in the frequency counter.

In general, the measurement of frequency by digital counting techniques involves the measurement of the number of zero-crossings of a given sense (i.e. positive going or negative going) which occur within a standard time interval. This technique may be employed for the measurement of muscial tones, and works satisfactorily. However, the indications available from standard digital counters are in terms of physical units, i.e. Hertz, which have no meaning to most musicians, and virtually no use even to those musicians who do understand their meanings.

Conversion of the counter output to terms which do have meaning and usefulness to musicians could be readily and straightforwardly done by use of digital computation techniques. Unfortunately, the computational power required would be large, and would be more expensive than is desirable or necessary. Use of a "brute force" look-up table technique, for example, would require a 9600 word memory having 16 bit word length.

Later operations on the digital word, by microprocessor 35 and display decoder 36, condition and transform the count for displaying in an appropriate format by display 37.

DETAILED DESCRIPTION OF THE APPARATUS

Adaptive Filter

As noted briefly above, the fundamental tones of some orchestral instruments are lower in amplitude than their harmonics. Because of this possibility, if the tuning aid has a flat frequency response characteristic, the fundamental tone may be falsely decoded as being one or more octaves higher than the actual fundamental due to the fact that the signal amplitude of the harmonic is higher than the fundamental and for this reason causes a response to be made to the harmonic rather than the fundamental. In the preferred embodiment, therefore, the frequency response characteristic of the tuning aid is adaptively shaped to attenuate the amplitude of the harmonics with respect to the fundamental.

Figure 2:
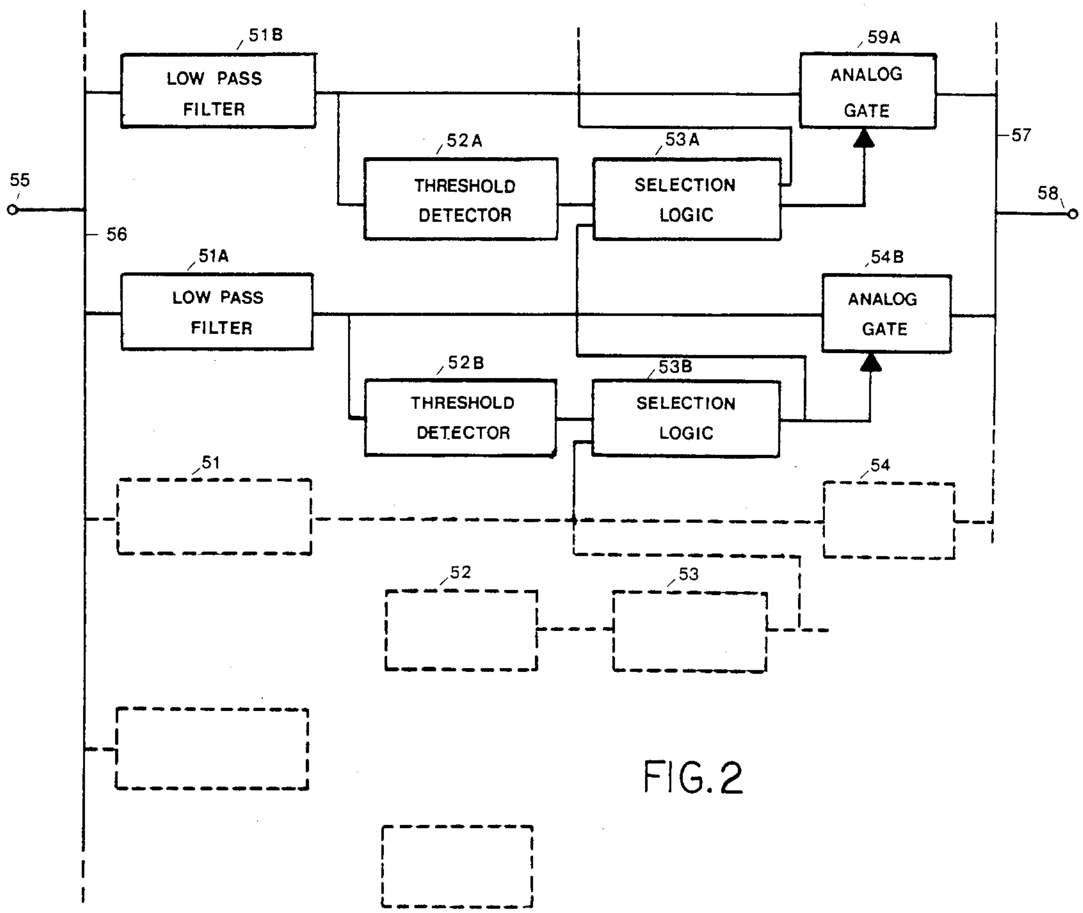
FIG. 2 is a more detailed block diagram of the adaptive spectrum analyzer portion of FIG. 1.

Referring now to FIG. 2, there is shown a more detailed block diagram of the adaptive filter 13 of FIG. 1. A plurality of relatively sharp cut-off filters 51, having corner frequencies spaced one-half of an octave ($\frac{1}{2}$) apart from each adjacent filter, are simultaneously driven with the amplified incoming frequency. At the output of each filter, a threshold detector 52 detects the presence or absence of signals above a certain minimum level.

Each threshold detector 52 in turn provides an output state to selection logic 54 which is indicative of the presence of a signal above the threshold. Selection logic 53 in turn controls the status of analog gates 54, in accordance with the criteria explained below.

Each low-pass filter 51 receives the same signal input from a common input bus 56, which is driven at input terminal 55 by the output of amplifier 14. Each filter 51 is preferably of a high input impedance to avoid loading the output of amplifier 14 excessively when a plurality of such filters is attached to the bus.

Each output of the filter is applied to the input of its associated analog gate 54 which, when enabled, passes the output of the filter directly to the output bus 57 and its associated output terminal 58 without significant attenuation. When disabled, the analog gate 54 blocks the output of the low-pass filters 51 and prevents their signals from passing onto output bus 57.

In general, the adaptive filter 13 attenuates all frequencies except the lowest frequency appearing at input bus 56 by enabling only the analog gate 54 associated with the lowest corner frequency low-pass filter 51 at which there is sufficient signal amplitude to be detected by the associated threshold detector 52.

In FIG. 2, the arrangement of low-pass filters 51 is in order of ascending corner frequencies from bottom to top. Assume, for the purpose of explanation, that a number of frequencies appear simultaneously on input bus 56 as a result of a note sounded in the vicinity of transducer 11. In general, the notes will be harmonically related. Assume further that the note is of a frequency such that it will be passed substantially unaltered by low-pass filter 51B, but will be attenuated by low-pass filter 51A.

Figure 3:
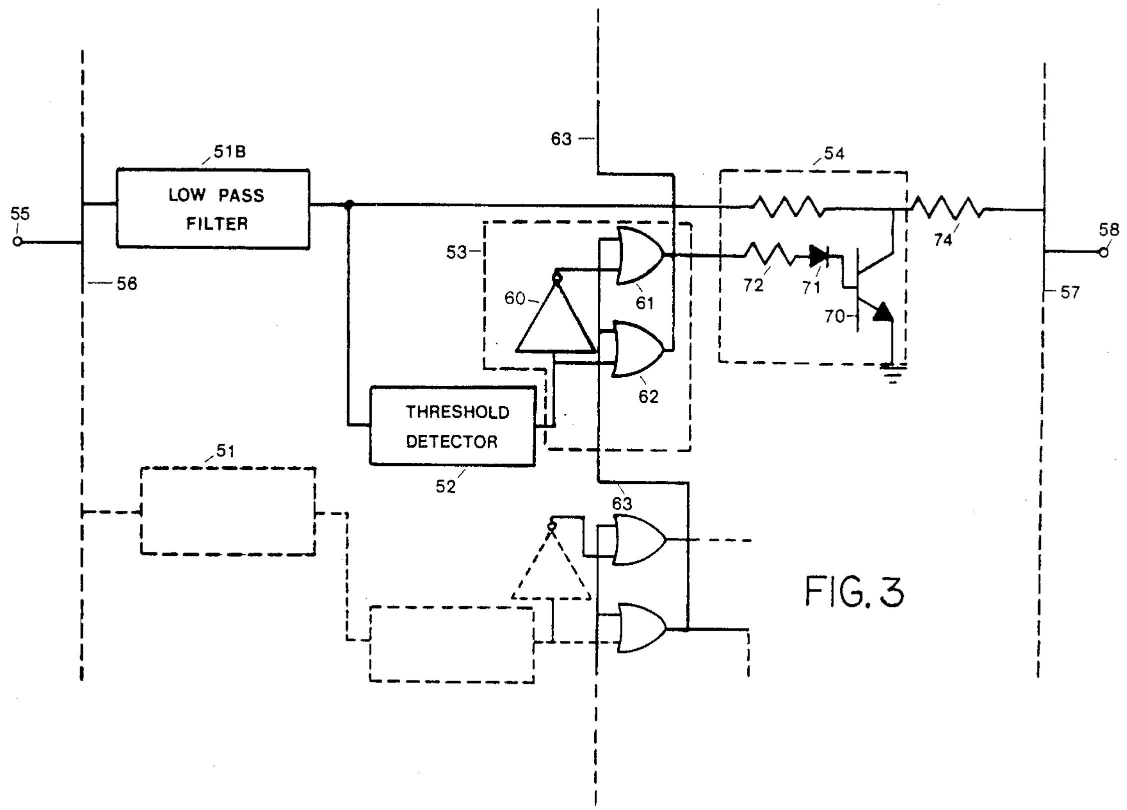
FIG. 3 is a circuit detail of the adaptive spectrum analyzer of FIG. 2.

The details of the adaptive filter may be better understood by referring now to FIG. 3, wherein there is shown a more detailed diagram of one channel and a portion of an adjacent channel in accordance with the present invention. In the Figure the elements included within the analog gate 54 and the selection logic 53 are now shown as functional circuits.

Within the analog gate 54 are included transistor 70, diode 71, base resistor 72, dropping resistor 73 and isolation resistor 74.

Considering first the analog gate 54, the transistor 70 is operated as a saturating switch which when ON allows signals from the output of the low-pass filter 51 to be conducted to the system return. This signal is thereby attenuated in accordance with the ratio of resistor 73 to the equivalent saturation resistance of transistor 70. Thus, the OFF condition of the gate results when the transistor is ON. Resistor 74 isolates the bus 58 from the collectors of the analog gates 54 so that the bus is not loaded excessively by the channels which are OFF.

In the ON condition for gate 54, transistor 70 is OFF allowing the signal from the output of low-pass filter 51 to pass through the gate 54 virtually unattenuated.

When gate 54 is in the ON condition, transistor 70 is held OFF by the output of gate 61 being low, which condition causes base drive current to be shunted away from the base. Resistor 72 isolates the output of gate 61 and establishes a predictable current into the base. Diode 71 provides a measure of noise immunity by artificially increasing the threshold voltage at which conduction into the base of transistor 70 will take place.

Considering next the operation of the selection logic, a signal below the corner frequency of low-pass filter 51B will be passed through the filter substantially unattenuated to the threshold detector 52, at which detector the output is indicates the presence of a signal as a "1". The output signal from detector 52 is applied directly to an input of OR gate 63, and also, after inversion by inverter 60, to an input of OR gate 61. The remaining inputs of OR gate 61 and 62 are supplied with signals from the OR gate in the position of OR gate 62, found in the adjacent channel having the next lowest cutoff frequency, through line 63. If line 63 is a "1" then it indicates that the next lower frequency channel is detecting the presence of frequencies within the range of sensitivity of that channel on input bus 56. In other words, it is an indication that the signal detected by threshold detector 52B is also being detected by at least the lower frequency channels corresponding to filter 51A, or perhaps by a still lower frequency channel.

Since the signal at line 63 causes a "1" to appear at the output of gate 62, which in turn causes a "1" to be applied to the input of the next gate and so on, it follows that the channel which detects the lowest frequency will cause all higher frequency channels to attenuate the signal.

Since all of the analog gates which are associated with any filter which has a cut-off frequency higher than the cut-off frequency of the filter which is passing with the lowest frequency note discerned by the apparatus are disabled, only the gate associated with the filter passing the lowest frequency is enabled. Thus, the filters of all higher cut-off frequencies are ineffective to pass frequencies within their cut-off characteristics and only the lowest cut-off frequency filter passes any signal at all. This technique allows the signal processing portion of the apparatus to adapt to the signal presented by analysis, and in particular allows it to tailor the response of the apparatus to accentuate the fundamental and to attenuate the harmonics of the lowest frequency incoming signal which is discernable by the threshold detectors.

It will be appreciated of course that realizable filters do not have the perfect cut-off characteristics which are desired and that, accordingly, a compromise in the expected performance of the instrument is required. Specifically, there may exist some sounded notes, for certain ranges of certain musical instruments, for which the harmonic amplitude exceeds that of the fundamental even after their relative amplitudes are alterated by the adaptive filter. Furthermore, under varying and unpredictable conditions of room acoustics and resonances, the fundamental may be inadvertently eliminated by "nulling" effects, while the harmonics may be emphasized by resonance effects. Some degree of experience with the tuning aid is therefore still a requirement in order to guard against false indications of octave range under certain conditions which a musician may encounter. Nonetheless, the situations in which the adaptive filter will be unable to properly select and emphasize the desired fundamental will be rare.

Accumulation of Counts; Desired Resolution

As described above, each cent is related to the cent next below it by the numerical ratio of 1.00057773—to one. Thus, the resolution of one cent requires apparatus which is capable of resolving frequencies to better than approximately 6 parts in $10^4$. Expressed in binary form, the apparatus must have a resolution capability of better than 1 part in $2^{14}$. In theory, a counter having exactly this length would suffice. In practice however, the resolution must be much better than the incremental resolution, which requirement in turn means that the resolution must be approximately 1 part in $2^{16}$ or better, and which itself, in turn, indicates a counter length of 16 bits. Fortunately, sixteen bits is an efficient counter length since many digital circuit building blocks are available which operate on multiples of 4 or 8-bit words. Accordingly, the main counter length is chosen to be 16 significant binary bits which correspond to the relative pitched of incoming signals. These 16 bits may however be shifted as is described below, in order to accomodate the full range of unknown frequencies, when counter spillover occurs.

Accumulation of Counts; Timing Uncertainty

Period measurement by means of digital techniques is beset by a fundamental minimum error which is caused by the timing uncertainty which results from the unpredictable variation in the relationship in time between the transition of the gate, and the transitions which occur on the gated clock. The error, as is well known, can never be less than plus or minus the period of one clock interval. Thus, as is also well known, to measure the period of a signal to an accuracy of one part in $2^{16}$, the counter must accumulate $2^{16}$ counts as a minimum.

This minimum acceptable number of counts can be accumulated within a single period of the unknown waveform if the clock frequency is arbitrarily high. However, this theoretical possibility immediately clashes with the practicalities of real-world electronics devices. First, it is desirable to have a clock frequency within the 5 to 10 megahertz range to take advantage of the inherent stability of crystals which are cut for this frequency range. In addition, to obtain $2^{16}$ counts within a single period of a tone at $A_8+50$ would require a clock frequency in the range of 110 megahertz, well beyond the capability of most inexpensive logic families, and an expensive oscillator range to boot. All problems of circuit layout and sensitivity to strays are also greatly compounded by frequencies within that range.

Instead of arbitrarily increasing the clock frequency, the present invention relies upon adaptively increasing the number of periods of the incoming signal which are measured. If a sufficient number of consecutive periods are added together, the total count accumulated may be made sufficiently large to allow the desired resolution.

Description of Main Counter

For convenience of reference within the succeeding paragraphs, the term "relative pitch" will be used to denote the pitch of notes within a given octave range, while "octave range" will be used to denote the specific locations within an octave of any of the relative pitches which are found in every octave. Thus, the relative pitch of a sounded note may be written as C-15¢, which specifies the location of the note within the octave range of any octave. For the same relative pitch located in the octave of the standard $A_4=440$ Hz, the notation $C_4$-15¢ will be employed, thereby completely specifying both the relative pitch and the octave within which the relative pitch is sounded, and thereby in turn completely specifying the absolute pitch of the note.

Main counter 30 is a 24-bit, straight binary counter capable of directly counting the frequency of the crystal oscillator 26. As noted above, 16 bits are specified as the minimum necessary to achieve the desired resolution.

For sounded notes at the lower portion of the range of operation, however, considerably more than 16 bits of information will be accumulated within the counter. This spillover of the first 16 bits is accumulated by the 8 most significant bits within the 24-bit counter.

Assume now that the counter has acquired a sufficient number of counts to cause the first 16 least significant bits (LSB's) to be filled, with or without overflowing to the next more significant bit in the counter. The information contained therein now fully characterizes the relative pitch of the sounded note. A read-out of the word contained within the counter exactly specifies, within the accuracy and resolution limitations of the apparatus, the relative position of the note within its octave. Determination of the correct octave requires further analysis, as will be explained below, but for the moment it should only be noted that the relative pitch is established and uniquely associated with the digital word stored within the binary counter 30.

Consider next the effect of sounding a note exactly one octave below that of the example. Since a sufficient number of counts to fill the first 16 LSB's of the counter was available during the period of a single cycle of the sounded note, it follows that the note one octave below it will cause twice as many counts to accumulate, thereby rippling the count through each stage of the counter. As a binary operation, doubling the count is equivalent to shifting the count one binary bit to the left, i.e. one bit more significant, of the count in the counter. The bit pattern of the sixteen most significant bits remains unaffected however, and decoding those sixteen bits will again characterize the relative pitch of the sounded note. The fact that the pattern is shifted one bit to the left, or one bit more significant in the counter, indicates that the note actually sounded is one octave lower in frequency than the note of the first example. By decoding both the frequency count in the 16-bits which characterize the relative frequency, and simultaneously determining where the count is shifted in the counter, both the relative pitch and its location in octaves is specified. In other words, the absolute pitch is now also known.

Multiple Inverval Operation of Main Counter

Examples of several pitch measurements will further illustrate the problem. At one extreme, to measure the frequency of a sounded note in the range of $C_o$, approximately 16.34 Hz, to an accuracy of 1 part in $2^{14}$ would require that approximately 16,000 counts be accumulated. This requirement is easily met and exceeded by accumulating the counts of the clock pulse over the period of a single cycle of the sounded note, which will result in a total count accumulation of approximately 524,000 counts. Within the middle range of frequencies, assume an input of $A_3=220$ Hz, the resulting count is then equal to 33,728, still sufficient to provide the desired resolution. As frequency increases however, the number of counts accumulated within a single cycle of the sounded note diminshes until, at a certain point, the resolution becomes marginal. Beyond this point, increasing the frequency of the sounded note still further will result in the count accumulation over a single cycle of the sounded note being clearly insufficient to provide the desired resolution. This point occurs theoretically at a pitch of about 450 Hz, somewhat above the standard $A_4$.

For practical considerations which are described above, the present invention operates on the assumption that a resolution of one part in $2^{16}$ is required rather than the theoretical minimum resolution of one part in $2^{14}$. Thus, $2^{16}$ or 65,538 counts are required for assuring sufficient resolution. In accordance with this resolution criterion, the practical frequency limit for the minimum resolution based upon single cycle period measurement is approximately 113 Hz, slightly above $A_2$.

Since a sounded note at $A_2$ will result in the bare minimum number of counts being accumulated in main counter 30, for sounded notes above $A_2$, a single period of the incoming waveform will not yield sufficient counts to allow the desired resolution. Therefore, more than one period of the sounded note is required in order to accumulate a sufficient number of counts to make the measurement to the desired accuracy.

Latch

Latch 32 is a 24-bit register, for temporarily storing the count accumulated in the main counter so that operation may be performed on the accumulated count without interfering with the continuous update of the count accumulation. In other words, the main counter 30 can operate independently of the computations which are performed on a previously accumulated count.

Selection of the Critical Frequency

It is desired for simplicity of the apparatus and for simplicity of the computations required, that the apparatus operate in octaves of the highest tone for which it is desired that the instrument function. In other words, it is desired that the critical frequency be determined and located at the upper limit of the apparatus' useful range.

Thus, for ease of decoding, the present invention is designed to operate in octaves which descend downward from a frequency which is equivalent to $A_8+50$¢. This frequency is selected as the assumed highest fundamental pitch of common orchestral and keyboard instruments which the instrument can be expected to encounter.

From consideration of the ranges of common orchestral, band, and keyboard instruments, $F_{cr}$ is selected as the frequency of $A_8+50$¢, which is the highest mistuning of the "A" four octaves above the standard $A_4$. Numerically, $A_8+50$¢ is equal to 7246.2878 Hz. It will be appreciated, however, that other ranges and other design center values may be chosen within the principles taught herein and that such variation will be readily apparent to those skilled in the art.

Chosing $F_{cr}$ as $A_8+50$¢ causes the instrument to operate in octaves of that tone. By choosing an oscillator frequency correctly, the LSB contents of the main counter 30 can be made to change states from all "ones" to all "zeros" at exactly the cross-over point between $A_n+50$¢ and $B_n-49$¢.

Display

Figure 6:
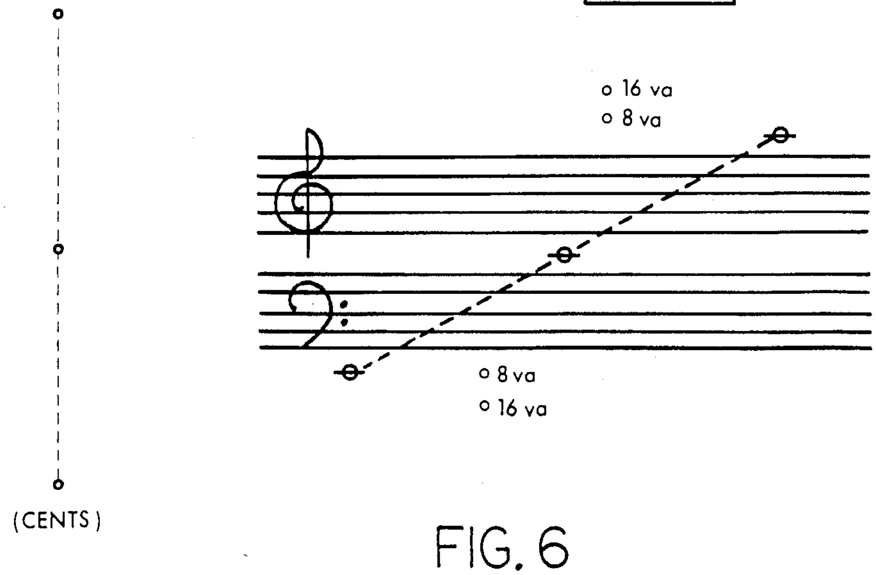
FIG. 6 is a depiction of a grand staff display in accordance with the present invention.

The tuning aid display 37 consists of a "grand staff", i.e., the bass and treble clefs and intermediate ledger lines, having a visual indicator at each line and space. An example of a display arrangement employing the grand staff is found in FIG. 6. For the preferred embodiment, the indicators are light-emitting diodes, although other indicators, self-illuminating or otherwise, may be employed.

To display sharps and flats, the so-called "accidentals", the indicator corresponding to the basic tone, and the indicator next above it or below it, depending upon whether the accidental is sharp or flat, are energized simultaneously.

Thus, for example, B-flat in the treble clef is displayed by illuminating B (the third line of the staff), and A, (the second space of the staff) simultaneously. For the even-tempered system of intonation, there is no difference in the flat of one base note and the sharp of the next lower adjacent base note so that A-sharp and B-flat, for example, are displayed identically.

Since the range of the instrument is wider than just the range of notes encompassed within the grand staff, and since the instrument is required to respond and display intonation accuracies for notes outside the range of the grand staff, the traditional notation of "8va . . . " is used to indicate when the note sounded is actually one octave above or below the note indicated on the staff. If it is above, a light-emitting diode marked "8va" and located above the grand staff is illuminated. If the note sounded is below, a light-emitting diode marked "8va" and located below the grand staff is illuminated. Sounded notes which are 2 octaves above or below the indicated notes are displayed by appropriately located "16va" lights, and so forth.

At the left of the grand staff is a vertical array of 100 indicators, preferably also light-emitting diodes, representing the one hundred "cents" into which each individual half-tone of the musical scale is divided. The fiftieth light from the bottom of the array is denominated "0". The top end of the scale corresponds to +50¢ and the bottom indicator corresponds to −49¢.

When a note is sounded which exactly aligns with the theoretically correct pitch for that particular note, two lights on the staff are illuminated, one corresponding to the nominal note within the grand staff and the other the "0" light of the cents indicating that there is no departure from theoretically correct intonation.

When a sounded note is slightly off pitch however, the cents scale displays a light above or below "0" cents by an amount proportional to the degree of departure from the theoretically correct intonation.

Under some conditions, as many as four lights on the display may be illuminated simultaneously. This would occur, for instance, when a note which is above the grand staff and is also an accidental is sounded.

The logical arrangement of the display and its use of conventions which are familiar to all trained musicians eliminates any difficulties of use which otherwise occur when unfamiliar display patterns are employed which require interpretation in non-musical terms, as do some of the prior art tuning devices. The readily perceived equivalency between the display and conventional musical notation also eliminates the need for a display in terms of physical units which are, in any case, of only limited value to a musician.

After a short period of familiarization, the user begins to rely upon the cents scale almost exclusively, with the absolute pitch notation being used only for verification that the sounded note is within the expected range.

Since vibrato and nonconstant intonation may produce a rapidly varying display, a display rate control slows down the rapidity of change in the cents scale to a rate which is suitable for viewing. Without such a display rate adjustment, due to the extremely rapid response time of the instrument the cents scale would be a blur of lights, clustered about the light which corresponds to the nominal center frequency of the sounded note.

Arithmetical Basis

The arithmetical determination of the note corresponding to the count may be made in any of a number of ways. With sufficiently great memory capacity, the task may be relegated to a "look-up" consisting of a large scale memory directly addressable by the "count", each word thus addressed corresponding to and directing the illumination of various lights within the display. The difficulty with this approach is the large memory capacity required, which would be approximately 9,600 words having a word length of 16 bits. While this amount of memory is readily attainable, the cost and size would be prohibitive. Even when the computation is normalized for standard octaves, a table having sufficient look-up capacity is still quite large.

Instead, the preferred embodiment employs a combination of look-up table values and numerical calculation to reduce circuit complexity and costs to manageable proportions. In particular, by recognizing that each possible value of the number to be displayed is related to all others by simple exponential relationships, the number of values required in the look-up table is reduced to 1,332.

It will be recalled that the raw count is obtained as set forth in the paragraphs above. The calculations thereafter proceed as follows.

Consider that the raw count X may be stated in terms of the following expression:

$$X=(2^{I_o/12})(2^{I_1/120})(2^{I_2/1200}) \quad [1]$$

where $I_o$, I, and $I_2$ are integers.

For counts having values within the expected range, the value of X may range from 1.0000 to 1.9999 - - - or, expressed as straight binary numbers, from 1.0000000000000000 to 1.111111111111111, corresponding to the relative pitches of notes which fall within the selected standard frequency range. The relative pitch of each closest half-tone is represented by the exponent of the first term in expression [1] since each note in the octave is related to each other note by the numerical ratio $2^{1/12}$.

Within the range of any one half-tone, the count will additionally vary as the second term of expression [1] varies between $I_1=0$ and $I_1=9$, while $I_2$ also varies between $I_2=0$ and $I_2=99$.

It will be appreciated that if I is selected to always be be the largest possible interger such that $2^{I_o/12}$ is still always less than or equal to X, then $I_1$ need not vary beyond $I_1=9$, for if $I_1=10$, then $I_0$ could be increased again by one unit while still satisfying $2^{I_o/12}\leqq X$.

Similarly, $I_2$ need not increase beyond $I_2=9$, for if $I_2=10$, then $2^{10/1200}=2^{1/120}$ so that the same numerical value could be achieved if $I_1$ has been increased by one unit.

Thus, it may be seen that any value of the "count" within the expected range may be expressed by proper selection of the numerators of the three exponents, and that for any such value, the numerators $I_0$, $I_1$ and $I_2$ will properly and uniquely characterize the count. Note, however, that the values of $I_1$ and $I_2$ are required to vary only from 0 to 9, a range limitation which is most advantageous since only a limited number of values must now be store in the look-up tables.

In summary, momentarily without regard for the octave range being considered, it may be stated that any raw count may be represented by a range of three numerators of exponents, which numerators extend over only over a limited range, 10 integers (0 through 9) for $I_1$ and $I_2$, 12 integers 0–11 for $I_0$. The decoding of the count therefore requires resort to only 10 or 12 values for each numerator variable.

Determination of the numerator integers proceeds as follows: First, the largest integer $I_0$ is determined such that $2^{I0/12} \leqq X$.

$$X' \text{ is then defined as } X' = \frac{X}{2^{I0/12}}$$

Next, the largest $I_1$ is found such that
$2^{I1/120} < X' \leqq 2^{I1+1/120}$
then divide X' by $2^{I1/120}$ and set the result equal to X''.

$$\text{Thus, } \frac{X'}{I_{1/120}} = X''$$

Next find the largest $I_2$ so that
$2^{I2/1200} < X'' \leqq 2^{I2+1/1200}$

All values of the exponent numerator integer $I_0$, $I_1$, and $I_2$ have now been established for the particular count X which was accumulated in the main counter.

The physical significance of the integers is as follows:

$I_0$ corresponds to the nominal value of the half-tone note which is being sounded.

$I_1$ corresponds to the tens position of the cents scale representing the departure from nominal in terms of cents.

$I_2$ corresponds to the units position of the cents scale representing the departure from nominal in cents.

To obtain the "display code" for the cents scale, multiply $I_1$, by 10 and add to $I_2$.

This number, $[(I_1 X10)+I_2]$ is sent to the display decoder as the display code for the cents scale.

The appropriate octave number is absent from the above calculations since the count X being evaluated is not the raw count but is the normalized count. Location of the absolute pitch of the sounded note may be obtained however by specifying the appropriate octave number and locating $I_0$ within that octave.

PROGRAM FLOW CHART—Calculation of Exponents

Control Flow Chart—Calcultion of "Count" & Display

Accumulation of counts may theoretically fall into three possible conditions: (1) the count obtained during one cycle of the incoming unknown is insufficient to fill the desired 16 bits of counter length; (2) the count obtained during one cycle exceeds the capacity of the counter, or; (3) the count is sufficient to exactly fill, but not to overflow the counter.

To insure that sufficient count is available, the counter is always required to fill and to overflow by at least one bit. Thus the third case, as a practical matter, cannot exist.

Overflow of the counter will be common for those notes which are lower in frequency than about 113 Hz. On the other hand, above about 113 Hz, insufficient count will accumulate within a single clock cycle. In the latter case, therefore, more than one period of the unknown must be allowed to accumulate.

Figure 4:
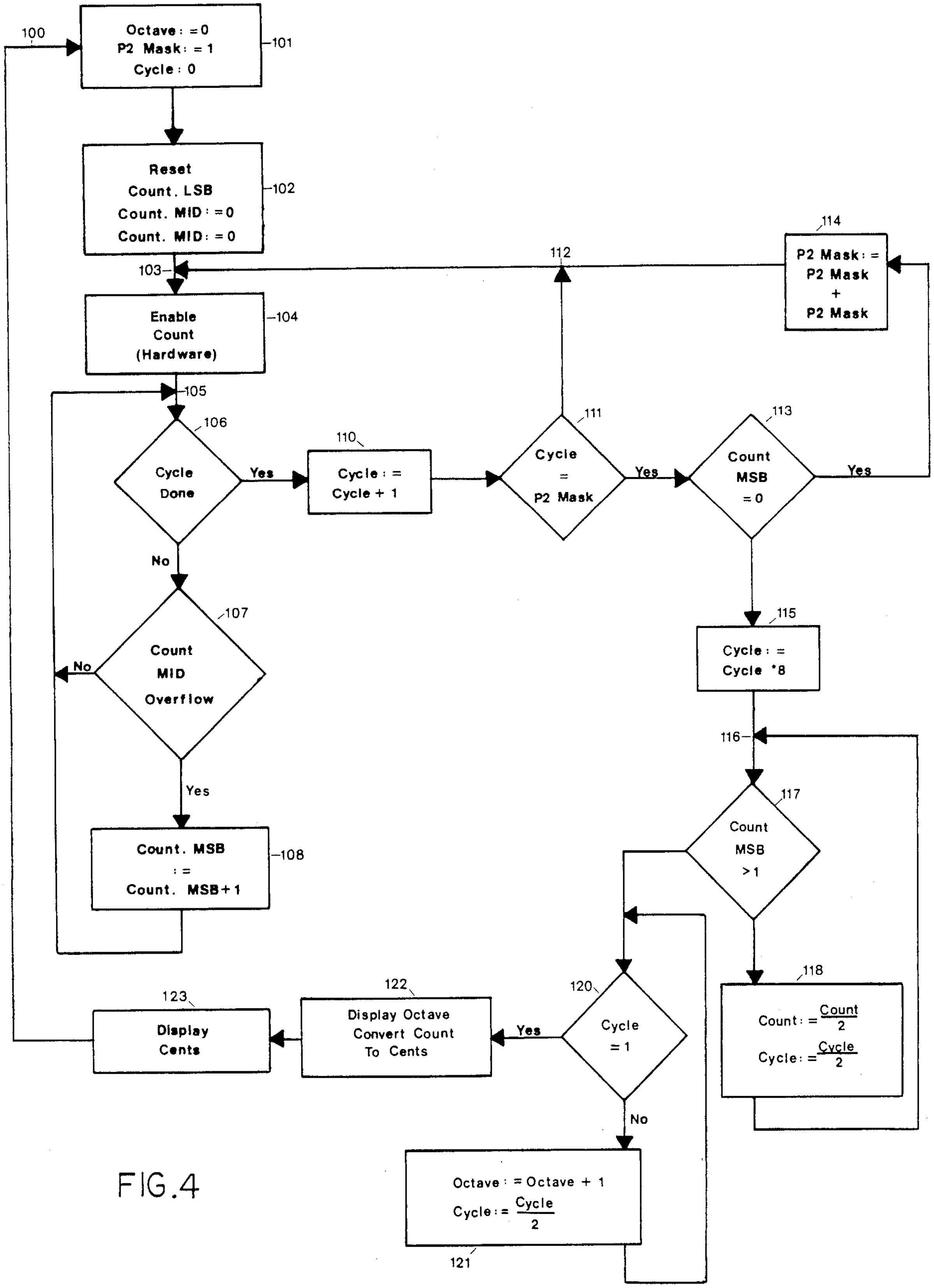
FIG. 4 is a flow chart showing the preferred method of obtaining a normalized count in accordance with the present invention.

Operation of the tuning aid in determining when sufficient count has been accumulated and selection of the appropriate octave may be best understood by referring to FIG. 4, in conjunction with FIG. 1. Referring specifically to FIG. 4, the conditions of the apparatus at major decision points for the two practical possibilities of the count status are illustrated namely: (1) counter is not filled, or; (2) counter is filled and possibly overflows.

Upon initialization of a count, which may occur upon power-on initialization, or upon the completion of a previous count cycle and display, the octave counter ("OCTAVE") is set to zero, the power of two mask, ("P2 MASK") is set to one, and the cycle counter ("CYCLE") is set to zero. These conditions are shown at block 101 of the control flow chart, FIG. 4. The LSB portion of the counter is reset, and the MSB and MID portions, which may be maintained as a microprocessor register are either reset or set to zero as is appropriate for their particular hardware configuration. These conditions are illustrated in the flow chart at 102.

Following establishment of these conditions 103, ENABLE COUNT HARDWARE 104 opens gate 23 for the period of one cycle of the unknown input frequency. If more than one period of the unknown is required to accumulate in order to provide a sufficient number of counts to fill the main counter LSB and MID, then this loop will be repeated as many times as is necessary.

After ENABLE COUNT HARDWARE 104, a decision point, CYCLE DONE?, 106, determines whether the cycle is done (YES) or not done (NO). If not done, (the condition which exists continuously until the MID portion of the main counter overflows), then the count continues to accumulate, and the CYCLE DONE?, 106, continues to record whether gate 23 is still enabled.

When MID overflows, COUNT.MID OVERFLOW, 107, is YES, and the MSB portion of the counter is incremented (COUNT.MSB:=COUNT MSB+1). However, for low frequency tones, the period of the incoming frequency may not yet have been completed. Thus, additional cycles of the clock may continue to be accumulated, causing MID to overflow repetitively. MSB is incremented on each overflow. For implementation as a straight binary counter, incrementation is of course accomplished by normal count carry.

If the count is less than required to fill MID to overflow, when CYCLE DONE? is YES, the cycle counter is incremented (CYCLE:=CYCLE+) at 110.

Each operation of enabling the main counter by the unknown incoming frequency is referred to as a count cycle. The number of count cycles required to fill the counter is counted by the cycle counter ("CYCLE"), which may be maintained within a microprocessor.

It is desired to simplify later calculations by forcing the number of count cycles over which count is accumulated to always be an exact power of two. This is in turn accomplished by masking out all possibilities other than exact powers of two in the cycle counter. The mask in easily implemented by a comparison subroutine which is called with each pass through the loop.

Thus, at decision point 111, the cycle counter is compared to the power of two mask, (CYCLE=P2 MASK?). If NO, then the cycle counter is not a power of two, and ENABLE COUNT again allows gate 23 to pass cycles of the clock to the LSB portion of the main counter 30. This loop, 103,106,110,111,112 is traversed repeatedly until CYCLE=P2 MASK?, 111, is YES. If YES, then the cycle counter does contain a power of two, and a decision is made 113 whether the COUNT.MSB is still equal to zero, or is greater than zero (COUNT.MSB=$\phi$?), 113.

If YES, then insufficient count has been accumulated to overlow MID, and the main counter has not been filled. The P2 mask is then doubled (P2 MASK:=P2 MASK+P2 MASK) and the counter is again enabled for another period of the incoming signal. This loop, 103,104,110,111,112,113,114 is traversed repeatedly until the MSB does not equal zero, indicating that LSB and MID have filled and overflowed into MSB.

At the other extreme, if the frequency of the unknown is low, the period will be great enough to fill both the LSB and MID portions of the counter, causing the overall count to spill over into the MSB portion. The MID portion of the counter is continuously monitored 107 to decide whether overflow has occurred. If so, on each overflow the COUNT.MSB is set equal, 108, to COUNT.MSB+1. This loop 105,106,107,108 is traversed until CYCLE DONE 106 is YES.

It will be noted that the simplest implementation of this loop would be provided by a serial-carry, straight binary counter which increments each time the MID counter overflows. The counter may of course be maintained by a microprocessor.

If the COUNT.MSB is greater than 1, (decision point 117) the MID counter has filled and spilled over into the MSB counter, not only once but several times, each additional spillover incrementing the counter by one.

When all conditions have been satisfied, i.e., MSB≠0, and CYCLE=P2 MASK, the count contained in the main counter is sufficiently large to allow calculation of the unknown to the desired resolution.

Following satisfaction of these conditions, the cycle counter is multiplied, 115, by 8. This procedure insures that the calculation next to be performed will result in the proper scaling of the octave number. The count which is eventually refined for processing and displaying is normalized to be equivalent to that accumulated for a single count cycle on frequencies within the vicinity of $A_3$ to $A_4$. Frequencies above and below this octave therefore require scaling to determine the correct octave. An incoming signal at a frequency equivalent to $A_0$ for example would cause the COUNT.MID to spill over 8 times. Since $A_3$ is three octaves above $A_0$, an octave correction must be made in order for the correct octave to be displayed by adding, in effect, three octaves to the base.

Thus, each time the cycle counter is halved (equivalent to shifting the octave indicated up one octave), the octave counter is incremented.

Assume that a count has been obtained during one cycle of the count accumulation process, which count just barely overflows COUNT.MID. The note corresponding to this time period will lie at approximately $A_2$, or approximately 113 Hz. The relationship between the number of cycles required to accumulate the count and the octave number may be established by noting that a direct relationship exists and that if the number of cycles is increased corresponding to shortened periods of the incoming frequency, the octave number is proportionally increased.

However, since all counts are normalized to a standard octave corresponding to the main counter 30 being filled at least once, the relationship of octave number to cycle number is offset downward by 3 octaves. Three octaves corresponds to 8 times the frequency. To scale the display therefore, the initial offset of octave number with respect to cycle number is adjusted by adding the equivalent of three octaves, i.e. by multiplying the cycle number by 8. Thereafter, when operations are performed on COUNT to normalize the count range to fit the main counter 30, the same operations are performed on CYCLE so that when the cycle number is itself normalized (CYCLE=1?) the octave offset is accounted for.

This procedure is illustrated by loops 116,117,118 and 120,121.

At 117, the COUNT.MSB is tested to determine if it is greater than 1 (MSB>1). If so, then an excess of count has been accumulated which must be normalized by successively halving it. IF MSB>1 is YES, the COUNT is halved, and CYCLE is halved (COUNT:=-(COUNT/2; CYCLE:+CYCLE/2)) at 118. This loop 117,118 is traversed repeatedly until COUNT. MSB>1 is NO.

When COUNT.MSB>1 is NO, the raw count has been properly normalized. It only remains to decode COUNT and to determine the proper octave number. Octave number is determined by evaluating CYCLE and successively halving CYCLE until CYCLE=1, 120. It will be recalled however that at block 120, CYCLE is the raw cycle number multiplied by 8. When CYCLE=1 is NO, and the cycle number is halved, 121, simultaneously the octave number is incremented, 121, (OCTAVE:=OCTAVE+1). To carry the original example through, before CYCLE=1, the loop 120,121 will have been traversed three times and OCTAVE will have been incremented three times so that OCTAVE equals 3.

At this point COUNT is converted to cents and the resulting nominal note and its detuning in cents is displayed. The calculation of the appropriate exponents is accomplished as set forth in the following discussion.

For frequencies above the standard octave, the raw count of the cycle counter indicates how many octaves above the standard octave are to be displayed. But since the standard octave is $A_3$, (3 octaves, or 8 times frequency multiplier) the cycle counter must be multiplied by 8 to normalize the octave number in any case.

Beginning with CYCLE*8 at decision point 120, the cycle number is halved and the octave number simultaneously incremented repetitively until CYCLE=1. The octave is then displayed as indicated above.

To make the computations indicated:

The count X may be expressed as X=X[J,I] where J may have values 0,1,2 so that X=X[0,I]+X[1,I]+X-[2,I], in which:

(1) X[0,I]=$2^{I/12}$, where I=0,1,2, - - - , 11;

(2) X[1,I]=$2^{I/120}$, where I=0,1,2, - - - , 9, and;

(3) X[2,I]=$1^{I/1200}$, where I=0,1,2, - - - , 9.

Figure 5:
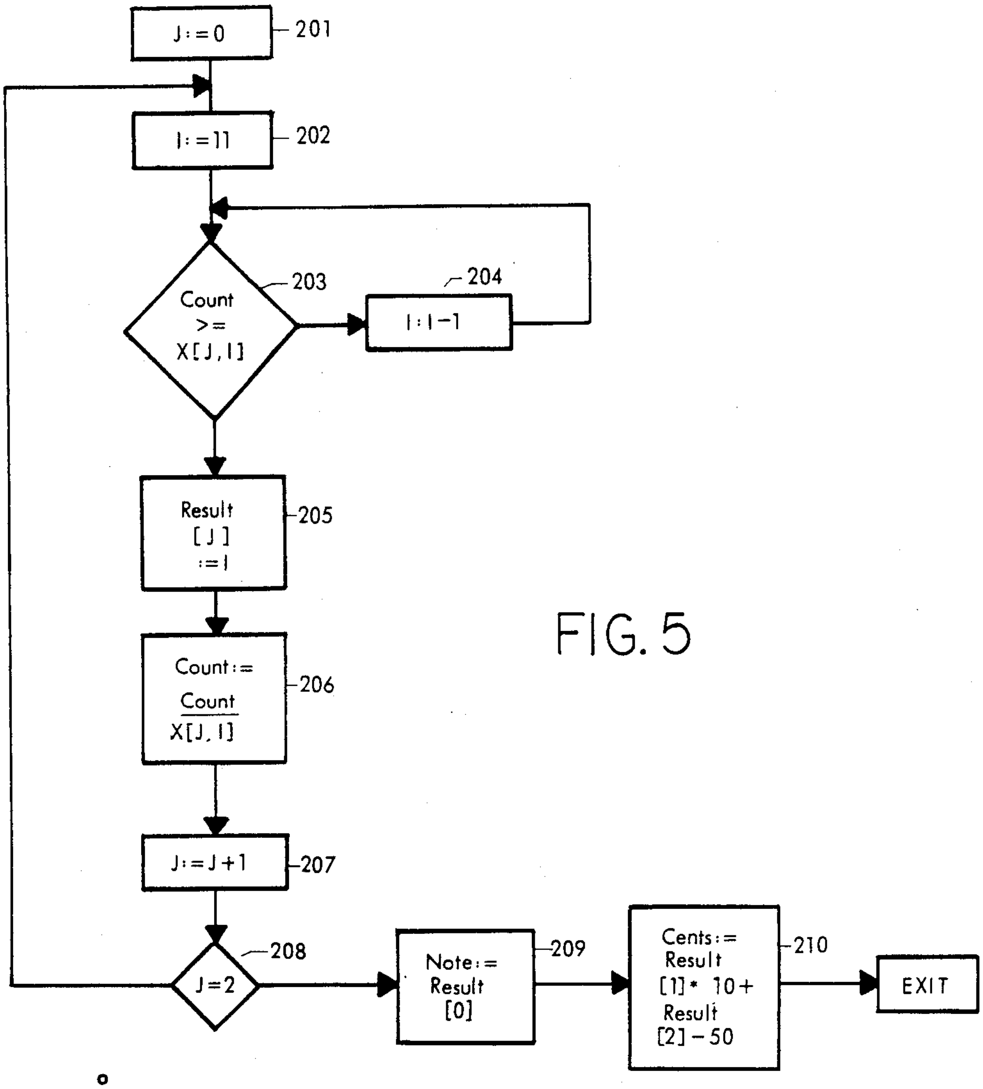
FIG. 5 is a flow chart showing the preferred method of evaluation of coefficients in accordance with the present invention.

Referring now to FIG. 5, initially J is set equal, at 201, to 0 (J:=0). Then I is set equal, at 202, to 11, the highest permissible value of I. The "count" is then compared to X[J,I] at that state, at 203, and, if COUNT is less than X[0,11], then the value of I is decremented (I:=I−1) is 204. This loop 203,204 is traversed repeatedly until COUNT is greater than or equal to X[0,I]. The value for [J], (the value of I for each J) is stored, 205.

When COUNT is greater than or equal to X[0,I], COUNT is then redefined as original count divided by X[J,I], equivalent to dividing both sides of the original equation by terms which have now been evaluated and I determined.

The value if J is then incremented at 208 (J:=J+1) and if now J≦2, the entire loop 201 through 208, beginning again with I:=11, is traversed repeatedly until all exponents have been determined (J=2).

Upon completion, the following definitions are applied:

NOTE:=Result [0]: (209);

CENTS:=Result [1]*10+Result [2]-50]: (210);

It will be appreciated that the principles taught in this description are those which are preferred, but that other variations of the invention set forth are practicable within the scope of the invention which is set forth in the following claims.

What is claimed is:

1. An electronic, tempered scale tuning aid for identifying and displaying the pitch of an unknown sounded tone in terms of its absolute pitch and its departure from correct nominal intonation comprising:

an oscillator having an output signal;

detection means for determining the period of the sounded tone;

a gate having a first input which is responsive to the oscillator output signal and a second input which is responsive to the detection means and having an output which is enabled when the second input is enabled;

a digital counter responsive to the output of the gate, said counter having at least sufficient number of bits to provide for the desired resolution of the accumulated count;

first digital logic means for determining when a sufficient number of counts has been accumulated in the counter;

second digital logic means for determining the relative frequency, in octaves, represented by the accumulated count, and for producing a digital word which corresponds uniquely to each frequency increment within an octave which is it desired to display;

a digital decoder having inputs responsive to the output of the second digital logic means and having outputs which uniquely correspond to the digital word inputs;

display means responsive to the outputs of the digital decoder said display having an indicator pattern which uniquely corresponds to the outputs of the digital decoder.

2. An electronic, tempered scale tuning aid for identifying and displaying the pitch of an unknown sounded tone in terms of its absolute pitch and its departure from correct nominal intonation comprising:

a transducer for converting the acoustic energy of the sounded tone into an electrical signal;

signal processing means for amplifying the electrical signals;

adaptive filter means for attenuating all signals greater in frequency than the lowest frequency tone contained in the unknown sounded tone which is discernible by the transducer and signal processing means;

a threshold detector;

an oscillator having an output and having an output signal frequency which is related to the frequency of the highest tone which is capable of measurement by the tuning aid;

a gate enable signal generator, responsive to the output of the threshold detector, for generating a gate enable signal which is exactly proportional to the period of successive, same-sense threshold crossings;

gate means, one input of which is responsive to the output of the oscillator and one input of which is responsive to the output of the threshold detector so that waveforms of the oscillator are passed through the gate during the time the gate enable signal is present and are blocked when it is not present;

counter means, responsive to the output of the gating means, for accumulating counts of the gated oscillator signal, said counter having sufficient length to accommodate the number of counts required to provide the desired resolution of the tuning aid;

first digital logic means for determining when the counter is filled;

second digital logic means for normalizing the count contained within the counter;

digital storage means for storing a set of values equal to the number of incremental pitches into which pitch can be resolved, each cent within an octave having assigned to it a specific digital address;

logic means for addressing the memory means;

display means responsive to the memory means for displaying the pitch which corresponds to the binary word stored within the counter.

* * * * *